United States Patent [19]
Halttunen et al.

[11] Patent Number: 6,088,068
[45] Date of Patent: Jul. 11, 2000

[54] HAND-HELD TRANSMISSIVE LCD HAVING A SEPARATION BETWEEN TOUCH SCREEN AND LC PANEL

[75] Inventors: Mikko Veijo Tapani Halttunen, Oulu, Finland; Jaakko Samuli Vänttilä, Solana Beach, Calif.

[73] Assignee: Nokia Mobil Phones, Ltd., Salo, Finland

[21] Appl. No.: 08/768,755

[22] Filed: Dec. 17, 1996

[30] Foreign Application Priority Data

Dec. 21, 1995 [GB] United Kingdom .................. 9526138

[51] Int. Cl.[7] .............................. G02F 1/133; G09G 5/00
[52] U.S. Cl. ............................................ 349/12; 345/173
[58] Field of Search .................... 345/12, 16, 23, 345/173; 349/12, 23, 29, 25

[56] References Cited

U.S. PATENT DOCUMENTS

| | | | |
|---|---|---|---|
| 555,502 | 9/1896 | Opel .................................. | 364/424.05 |
| 4,545,023 | 10/1985 | Mizzi .................................. | 364/709 |
| 4,876,537 | 10/1989 | Oyamada ........................... | 340/825.44 |
| 5,016,002 | 5/1991 | Levanto ............................. | 340/756 |
| 5,233,502 | 8/1993 | Beatty et al. ..................... | 361/729 |
| 5,272,470 | 12/1993 | Zetts ................................. | 345/173 |
| 5,402,151 | 3/1995 | Duwaer ............................. | 345/173 |
| 5,623,280 | 4/1997 | Akins et al. ..................... | 345/104 |
| 5,668,570 | 9/1997 | Ditzik ............................... | 345/173 |
| 5,691,747 | 11/1997 | Amano .............................. | 345/167 |
| 5,729,219 | 3/1998 | Armstrong et al. .............. | 341/20 |
| 5,805,416 | 9/1998 | Friend et al. .................... | 361/686 |

FOREIGN PATENT DOCUMENTS

| | | |
|---|---|---|
| 0 535 401 | 7/1993 | European Pat. Off. . |
| 2 089 549 | 6/1982 | United Kingdom . |
| 2 095 454 | 9/1982 | United Kingdom . |
| 2 153 620 | 8/1985 | United Kingdom . |
| WO 90/04806 | 5/1990 | WIPO . |
| WO 94/13088 | 6/1994 | WIPO . |

*Primary Examiner*—William L. Sikes
*Assistant Examiner*—Toan Ton
*Attorney, Agent, or Firm*—Perman & Green, LLP

[57] ABSTRACT

Display apparatus, particularly for hand-held equipment, comprising a display means adjustable to vary the transmission of light therethrough and a light source for transmitting light through the display means. A translucent or opaque screen may be provided for receiving light transmitted through the display means. The light transmitted through the display means may be projected to a surface remote from the display apparatus.

7 Claims, 4 Drawing Sheets

HAND-HELD TRANSMISSIVE LCD HAVING A SEPARATION BETWEEN TOUCH SCREEN AND LC PANEL

BACKGROUND OF THE INVENTION

This invention relates to display apparatus.

LCD (liquid crystal display) units are commonly used in hand-held equipment. In their normal form they comprise a twisted nematic device with a mirror behind. However, they have several disadvantages. For example, in confined spaces the size of image that can be achieved is limited by the need to fit connections around the sides of the LCD unit. It is also desirable to reduce the size of the display unit to leave more room inside the equipment without reducing the size of the image.

SUMMARY OF THE INVENTION

According to a first aspect of the present invention there is provided display apparatus for hand-held equipment, comprising a display means adjustable to vary the transmission of light therethrough and a light source for transmitting light through the display means. The display apparatus preferably comprises a screen for receiving light transmitted through the display means. The screen is preferable touch and/or contact sensitive.

According to a second aspect of the present invention there is provided display apparatus for hand-held equipment, comprising: a display means adjustable to vary the transmission of light therethrough; a light source for transmitting light through the display means; and two spatially separated screen regions for receiving light transmitted through the display means and each displaying an image resulting from that light.

The display apparatus is suitably for hand-held equipment.

The light source is suitably located behind the display means. The light source is preferably a substantially localised light source. Preferably the apparatus is arranged so that a divergent beam of light is transmitted towards the display means and/or the screen. The light source preferably projects light through the display means.

The apparatus may have more than one light source and suitably those light sources may each emit different colours of light from each other.

The display means suitably has an active region that is adjustable to vary the transmission of light through the display means. The active region is suitably planar and spaced from the light source. The transmission of light through the display means or any part of it is preferably adjusted electrically, suitably by a control means of the display apparatus, which is coupled to the display means.

The screen is suitably located at or near the exterior surface of the hand-held equipment. The screen is preferably arranged so that an image generated by the display means is displayed on the screen. The image is preferably enlarged in comparison to the corresponding pattern at the active region of the display means. The active region of the display means is suitably spaced from the screen to allow for magnification of the image. The screen may be translucent so that at least some of the light from the light source that has passed through the display means may be transmitted through the screen after passing through the display means. Alternatively, the screen may be opaque and may preferably reflect at least some of the light that has passed through the display means. At least part of the screen may be integrated with or constituted by at least part of a pressure-sensitive input means such as a keypad.

The display apparatus may be integrated into a self-contained display device. The display apparatus is preferably adapted to be contained in the hand-held equipment. The hand-held equipment is preferably a hand-held device such as a portable telephone.

BRIEF DESCRIPTION OF THE DRAWINGS

The present invention will now be described by way of example with reference to the accompanying drawings, in which.

Similar parts are given the same reference numerals in each Figure.

DESCRIPTION OF THE PREFERRED EMBODIMENTS

Figure 1:
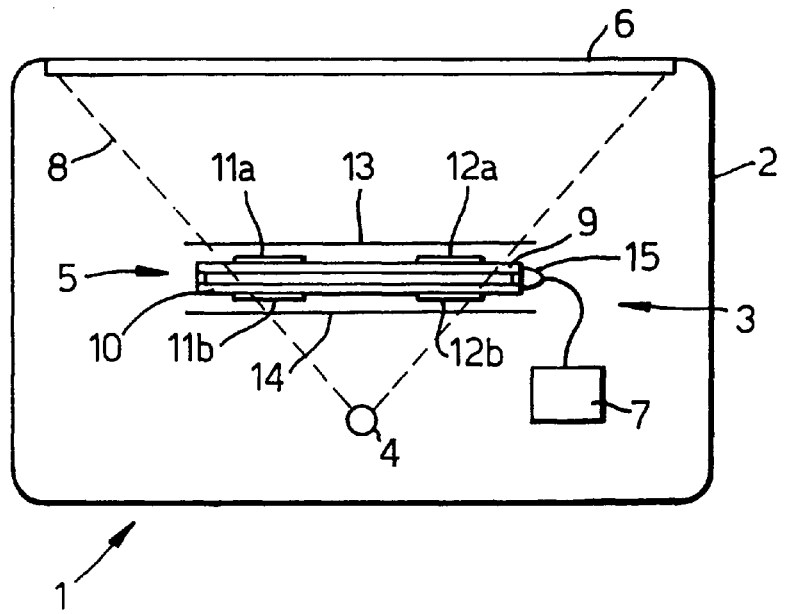
FIGS. 1 to 5 and 9 show schematic cross-sectional views of hand-held, portable telephones.

FIG. 1 shows a hand-held, portable radio telephone 1 having an outer casing or body 2 and including display apparatus shown generally at 3. The display apparatus comprises a light source 4, a display means 5 and a display screen 6. Transmission of light through the display means is adjustable by control means 7. The light source is located behind the display means (as seen in the viewing direction). It can transmit light, as indicated by beam 8, through the display means (from one side of the display means to the other) to the screen 6 when at least part of the display means permits light to be transmitted through it.

The light source 4 is an LED (light emitting diode). It could be any other suitable light source, for example an incandescent electrical bulb. As illustrated in the figures the light source is localised, notably in a plane normal to the general direction of beam 8. In the embodiment of FIG. 1 this is also the plane of the display means and the screen.

Figure 2:
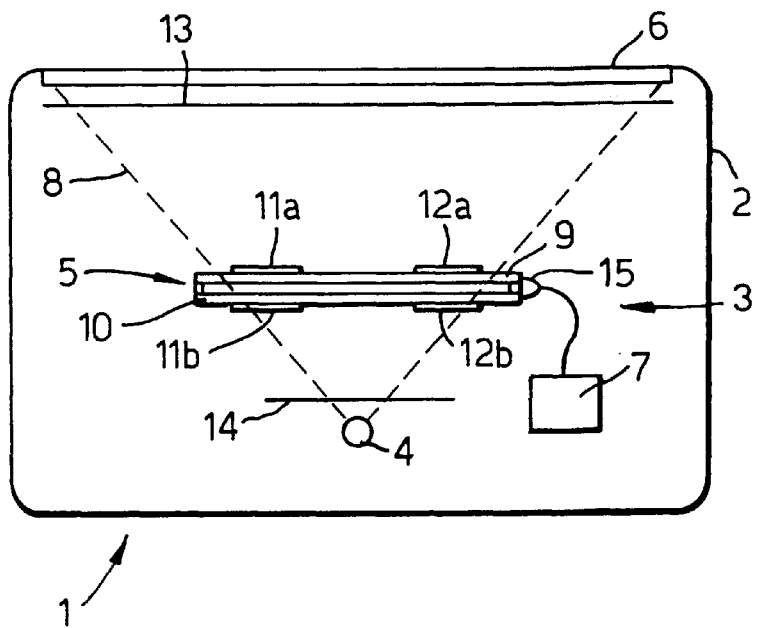

The display means is, for example, an LCD unit. The figures illustrate a twisted nematic LCD unit 5, having a generally planar active region of liquid crystal molecules encapsulated between transparent plates 9, 10. In the conventional way electric charges can be applied between electrodes 11a, 11b and 12a, 12b to vary the polarization of light passing through various parts of the unit. In conjunction with polarizers 13, 14, which are to be regarded as part of the display means, this has the effect of varying the transmission of light through various parts of the unit, in a pattern defined by the pattern of the electrodes' locations. The polarizers can be in the form of film sheets. They can be located near the plates 9, 10 (as illustrated in FIG. 1) or nearer to the LED or the screen (as illustrated in FIG. 2). The LCD unit does not include a rear mirror as is present in the prior art described above The control means 7 is a processing unit coupled to the LCD unit by connectors 15 arranged in the conventional way at the edge of the unit.

The screen 6 shown in FIGS. 1 to 5 is a sheet of rigid, translucent material (for example a suitable plastics material) located at the exterior surface of the telephone. Light from the light source that passes through the LCD unit is projected to the rear of the screen to form an illuminated image on the screen, visible from the front, corresponding to the pattern of light transmission through the LCD unit. The translucent screen diffuses to some extent the light received from the light source (either because of its internal structure or because of surface roughening), so that from the outside the translucent screen appears bright in regions where it is lit by the light source. The translucent screen also has the aesthetic advantage that from outside it is not possible to view the interior of the telephone accurately through the screen. The screen could be opaque in regions where the image is not to be displayed.

Figure 3:
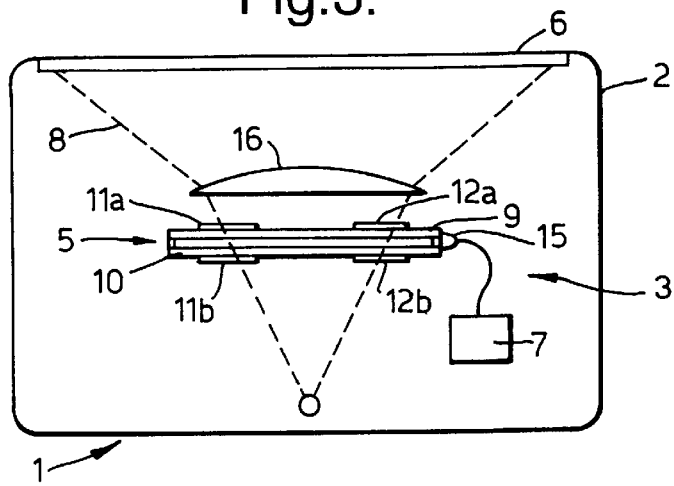

The image formed on the screen is magnified in comparison with the corresponding pattern at the active region of the LCD unit. This results from the optical arrangement in the display apparatus. In the direction of the light beam the active region of the LCD unit is spaced from the light source and from the screen. One way to achieve the magnification is then by causing light from the LED to be dispersed in a divergent beam between the active region of the LCD unit and the screen. The light source itself may emit a divergent beam, as in FIG. 1. Alternatively, or in addition, light directing means such as lenses or mirrors may be located between the light source and the active region of the LCD unit or between the active region and the screen and used to direct a divergent beam. FIG. 3 illustrates the use of a magnifying lens 16 located between the active region of the LCD unit and the screen.

In comparison with conventional display apparatus the magnification allows a smaller LCD unit to provide an image of the same size. This leaves more room inside the casing of the telephone. Also, the screen and the image on it can extend close to the edge of the telephone, whereas in conventional display apparatus room normally has to be left for the connectors at the edge of the LCD unit.

Figure 4:
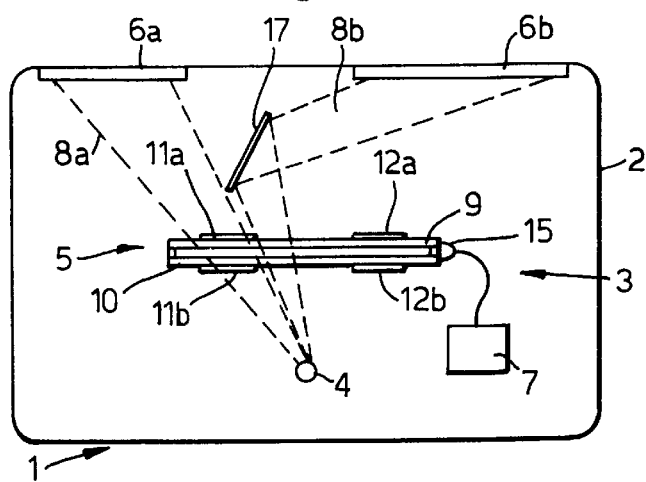
Figure 5:
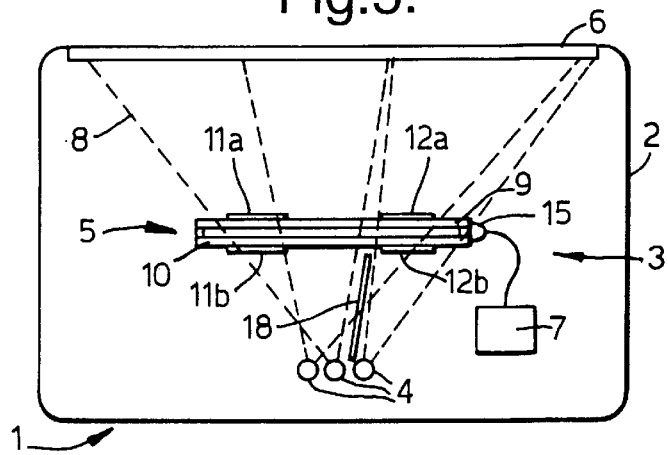

Other arrangements of display may be used. FIG. 4 illustrates a mirror 17 which divides the light beam 8 into beams 8a, 8b. The divided light forms images on separate screens 6a, 6b. More than one light source 4 may be used to project light through a single display means, as illustrated in FIG. 5. Each light source may emit light of a different colour from the other(s) to produce images having portions of different or mixed colours. A divider, for example in the form of a slat 18, may be used to separate light from light sources into distinct beams of light.

Figure 6:
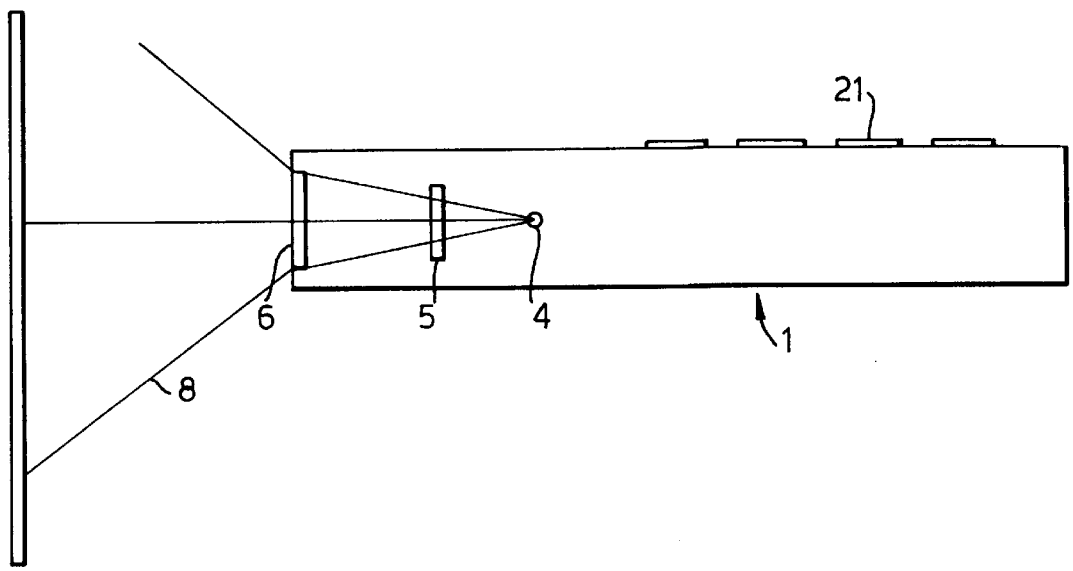
FIGS. 6 to 8 show schematic external views of other hand-held, portable telephones.

FIG. 6 illustrates an embodiment in which the screen 6 is transparent, and acts as a lens, and the display apparatus projects the light to form an image that can be displayed on a surface distant from the telephone 1. A keypad 21 is provided in the normal way on the face of the telephone.

Figure 7:
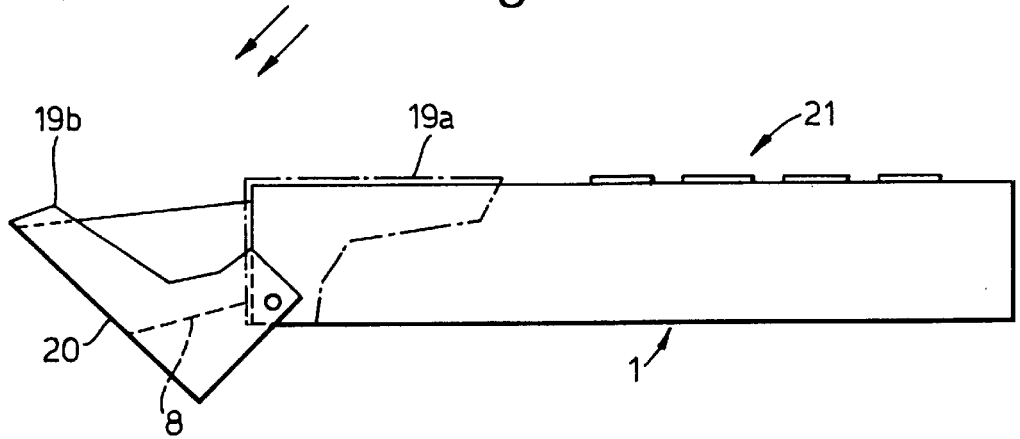

FIG. 7 illustrates an embodiment in which the display apparatus comprises an opaque screen (or cover) hinged to the end of the outer casing of the telephone. In its closed configuration 19a the screen shields the remainder of the display means. In its open configuration 19b the screen provides a surface 20 outside and spaced from the main body of the telephone on which an image can be projected. The screen reflects at least some of the light that passes through the display means so that a user can see the image on the screen. The screen could be movable with respect to the body of the telephone in other ways; for example it could be slideable from one configuration to the other.

Figure 8:
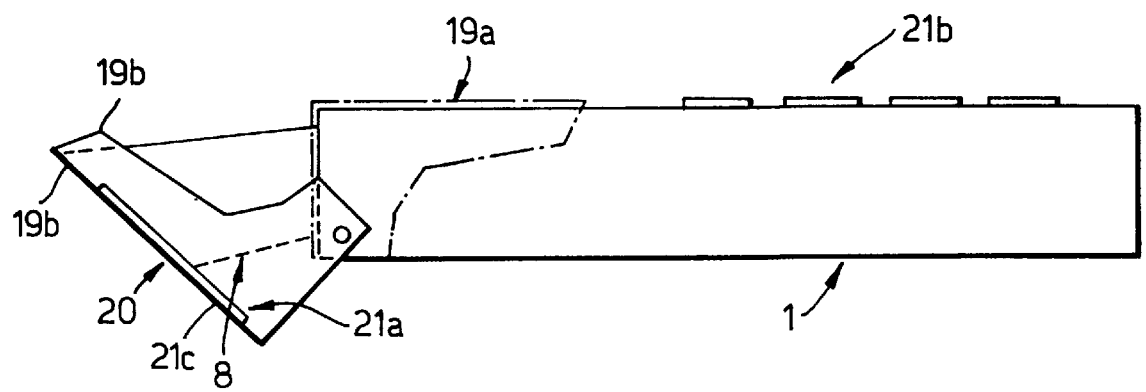
Figure 9:
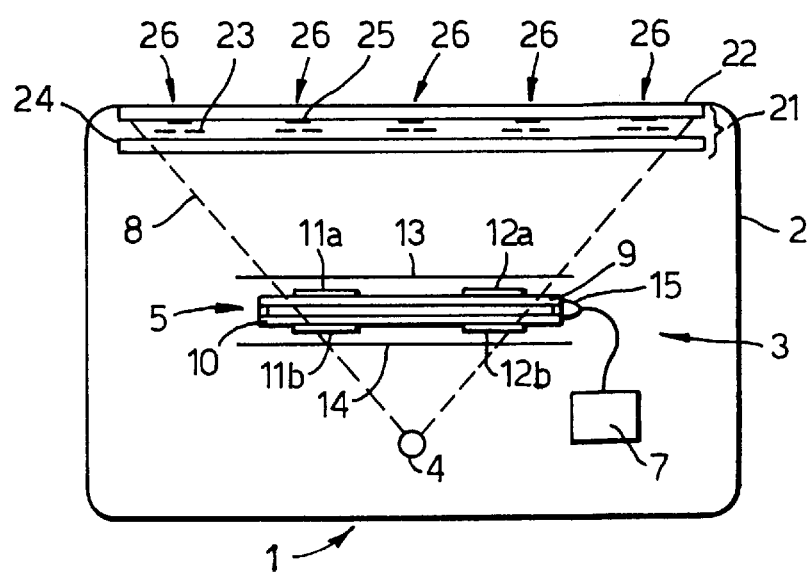

FIGS. 8 and 9 illustrate embodiments in which information is displayed by the display means on a keypad of the telephone. In these embodiments the keypad, or at least part of it, constitutes the screen. The displayed information could, for example, include information relating to the functions of the keys in the keypad.

FIG. 8 illustrates an embodiment in which the display apparatus is integrated with the telephone's keypad 21. A keypad 21a is provided on the interior surface of the movable screen 19 and connected to the processing apparatus in the body of the telephone by flexible connectors. The display means can display information on the surface of the keypad 21a by shining light through the display unit and on to the surface of the keypad. The keypad 21a reflects at least some of the light so that a user can see the image. A conventional keypad 21b is also provided. Some regions 19b of the screen do not overlap with the keymat. Some regions 21c of the keypad do not receive the image.

In the embodiment of FIG. 9, the display apparatus is integrated with a keypad 21 in the body of the telephone and light is projected through the keypad. A translucent, flexible keymat 22 made of plastics material, and circuit tracks 23 for the keypad, are arranged in front of a rigid, transparent (or translucent) rear support 24. Circuit areas 25 are provided on the rear of the keymat. The circuit areas are associated with pressure-sensitive zones 26 of the keymat. In the conventional way, when a user presses the keymat in a pressure-sensitive zone a circuit area 26 in the region of that zone touches the circuit tracks 23 and makes a circuit between them. Because the keymat is translucent and the support is transparent an illuminated image can be projected through the support by the light source 4 and the display means 5 and formed on the keymat. The image may be formed on a screen under the keymat: in that case the rear support 24 may be translucent and may receive the image and the keymat may be transparent. Overlapping the display and the keypad may allow the size of the telephone to be reduced.

For aesthetic reasons there is a need to make the circuit tracks as unobtrusive as possible. The boundaries between the pressure-sensitive zones may be marked by opaque lines on the keymat under which much of the length of the circuit tracks may pass. Alternatively, the circuit tracks themselves could mark the boundaries of the pressure-sensitive zones by blocking light from the display means to the boundaries. Alternatively, the tracks may be as thin as possible.

In the embodiments of FIGS. 8 and 9 the display means can display an image on, near or, in general, associated with the touch-sensitive zones of the keypads. The image may give information relating to the current functions of the touch-sensitive zones and may be varied from time to time. This is especially useful if the touch-sensitive zones constitute soft keys. In that case the appearance of a soft key, or the region near or associated with it, may be varied by displaying indicia relating to the soft key's function—for example the word "menu" or a suitable icon.

In view of the above description it will be clear to a person skilled in the art that various modifications may be made within the scope of the invention. The invention may include any novel features or combinations of features disclosed herein either explicitly or implicitly and any generalisations thereof irrespective of whether they relate to the invention as claimed or mitigate any of the problems addressed by the invention as claimed.

What we claim is:

1. Display apparatus for hand-held equipment, comprising:

a light-transmissive display means adjustable to vary the transmission of light therethrough;

a light source on one side of the display means and spaced therefrom for projecting artificial light through the display means; and a screen on the other side of the display means and spaced therefrom for receiving light transmitted through the display means and displaying an image resulting from that light, at least part of the screen being constituted by at least part of a pressure-sensitive input means.

2. Display apparatus according to claim 1, in which the display means has an active region which can be adjusted to vary the transmission of light through the display means to display said image.

3. Display apparatus according to claim 2, in which the image is magnified in comparison to a corresponding pattern at the active region.

4. Display apparatus according to claim 1, in which the screen is moveable with respect to a body of the hand-held equipment for displaying the image.

5. Display apparatus according to claim 1, in which the screen is located at an exterior surface of the hand-held equipment.

6. Display apparatus according to claim 1, in which the screen comprises a translucent region.

7. Display apparatus according to claim 1, in which the screen comprises a region that is at least partially reflective.

* * * * *